United States Patent
Wang

(10) Patent No.: US 9,538,647 B2
(45) Date of Patent: Jan. 3, 2017

(54) SUBSTRATE STRUCTURE AND MANUFACTURING METHOD THEREOF

(71) Applicant: Chao-Min Wang, Hsinchu County (TW)

(72) Inventor: Chao-Min Wang, Hsinchu County (TW)

(73) Assignee: SUBTRON TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/450,297

(22) Filed: Aug. 4, 2014

(65) Prior Publication Data
US 2015/0342040 A1    Nov. 26, 2015

(30) Foreign Application Priority Data
May 26, 2014   (TW) .............................. 103118287 A

(51) Int. Cl.
*H01L 21/84*     (2006.01)
*H05K 1/03*      (2006.01)
(Continued)

(52) U.S. Cl.
CPC ............. *H05K 1/0313* (2013.01); *H01L 21/48* (2013.01); *H01L 23/498* (2013.01);
(Continued)

(58) Field of Classification Search
CPC ...... H05K 1/0313; H05K 3/46; H05K 1/0298; H05K 1/114; H05K 1/115; H05K 2203/0214; H05K 2201/0154; H05K 2201/0145; H05K 2201/035; H05K 2201/0355; H05K 3/007; H05K 3/02; H05K 3/048; H01L 21/48; H01L 23/498; H01L 2924/1515; H01L 21/8221; H01L 27/1108; H01L 27/12013; H01L 27/11; H01L 27/0688
See application file for complete search history.

(56) References Cited

U.S. PATENT DOCUMENTS

| 2009/0159559 A1* | 6/2009 | Zhu ..................... H05K 3/4617 216/17 |
| 2014/0060902 A1* | 3/2014 | Hu ...................... H05K 1/0296 174/257 |
| 2014/0124475 A1* | 5/2014 | Lee .................... H05K 3/0097 216/18 |

FOREIGN PATENT DOCUMENTS

| CN | 101472404 | 12/2011 |
| CN | 103813659 | 5/2014 |

(Continued)

OTHER PUBLICATIONS

"Office Action of Taiwan Counterpart Application," issued on Oct. 4, 2016, p. 1-p. 3, in which the listed references were cited.

*Primary Examiner* — Daniel Luke
*Assistant Examiner* — Khatib Rahman
(74) *Attorney, Agent, or Firm* — Jianq Chyun IP Office

(57) ABSTRACT

A substrate structure is provided. The substrate structure includes a substrate and a carrier. The substrate includes a first through hole, a first surface and a second surface opposite to the first surface. The first through hole penetrates the substrate for connecting the first surface and the second surface. The carrier includes a second through hole, a release layer, an insulating paste layer and a metal layer. The insulating paste layer is disposed between the release layer and the metal layer. The carrier is attached to the second surface with the release layer thereof. The second through hole corresponds to the first through hole and penetrates the carrier for exposing the first through hole.

16 Claims, 4 Drawing Sheets

(51) Int. Cl.
*H05K 1/02* (2006.01)
*H05K 1/11* (2006.01)
*H05K 3/46* (2006.01)
*H01L 23/498* (2006.01)
*H01L 21/48* (2006.01)
*H05K 3/00* (2006.01)

(52) U.S. Cl.
CPC ........... *H05K 1/0298* (2013.01); *H05K 1/114* (2013.01); *H05K 1/115* (2013.01); *H05K 3/007* (2013.01); *H05K 3/46* (2013.01); *H01L 2924/15151* (2013.01); *H05K 2201/0145* (2013.01); *H05K 2201/0154* (2013.01); *H05K 2201/035* (2013.01); *H05K 2201/0355* (2013.01); *H05K 2201/09063* (2013.01); *H05K 2203/0214* (2013.01); *H05K 2203/1178* (2013.01); *Y10T 156/10* (2015.01)

(56) References Cited

FOREIGN PATENT DOCUMENTS

| | | |
|---|---|---|
| TW | 201410088 | 3/2014 |
| TW | 201410094 | 3/2014 |

\* cited by examiner

US 9,538,647 B2

SUBSTRATE STRUCTURE AND MANUFACTURING METHOD THEREOF

CROSS-REFERENCE TO RELATED APPLICATION

This application claims the priority benefit of Taiwan application serial no. 103118287, filed on May 26, 2014. The entirety of the above-mentioned patent application is hereby incorporated by reference herein and made a part of this specification.

BACKGROUND OF THE INVENTION

1. Technical Field

The invention relates to a substrate structure and a manufacturing method thereof and particularly relates to a substrate structure that a substrate and a carrier are separable and a manufacturing method thereof.

2. Description of Related Art

Circuit substrates are used in a variety of electronic products for electrical signal conduction, power supply, and ground connection. Owing to the trend of miniaturization of electronic products, the development of circuit substrates also aims at becoming lighter and thinner and having higher circuit intensity. However, during the chip packaging process, the thinner and lighter substrates are commonly found with issues such as cracking or defective wiring. To increase the yield rate of the process as well as the working efficiency, it is common to have a plurality of non-defective substrates adhered onto a carrier by using an adhesive layer to increase the rigidity of the overall substrate structure. Then, the adhered substrates and carrier are sent to the subsequent chip packaging process.

Nevertheless, when the substrate is designed with a gas aperture for ventilation or a sound hole for resonance to meet some special requirements, the gas in the gas aperture or the sound hole may be heated and expanded in the thermal compression process or other high temperature processes. The expanded gas then presses the carrier covering the gas aperture or sound hole, making the substrate released from the carrier during the process and thus influencing the yield rate of the process. Thus, a method that is capable of stably bonding the substrate and the carrier during a manufacturing process while easily separating the substrate and the carrier is certainly needed in this field.

SUMMARY OF THE INVENTION

The invention provides a substrate structure having a favorable yield rate and the carrier thereof is separable from the substrate.

The invention provides a manufacturing method of a substrate structure. The substrate structure manufactured according to the method has a favorable yield rate and a carrier thereof is separable from the substrate.

The substrate structure according to the invention includes a substrate and a carrier. The substrate includes a first through hole, a first surface, and a second surface opposite to the first surface. The first through hole penetrates the substrate for connecting the first surface and the second surface. The carrier includes a second through hole, a release layer, an insulating paste layer, and a metal layer. The insulating paste layer is disposed between the release layer and the metal layer. The carrier is attached to the second surface by attaching the release layer to the second surface. The second through hole corresponds to the first through hole and penetrates the carrier for exposing the first through hole.

A manufacturing method of a substrate structure of the invention includes steps as follows. First, a substrate is provided. The substrate includes a first surface and a second surface opposite to the first surface. Then, a first through hole is formed on the substrate. The first through hole penetrates the substrate for connecting the first surface and the second surface. Then, a carrier is provided. The carrier includes a release layer, an insulating paste layer, and a metal layer. The insulating paste layer is disposed between the release layer and the metal layer. Then, a second through hole is formed on the carrier. The second through hole penetrates the carrier. Afterwards, the substrate is laminated on the release layer of the carrier. Moreover, a position of the second through hole corresponds to a position of the first through hole for exposing the first through hole.

According to an embodiment of the invention, a diameter of the second through hole is greater than a diameter of the first through hole.

According to an embodiment of the invention, a material of the release layer includes polyethylene terephthalate (PET) or polyimide (PI) film.

According to an embodiment of the invention, a material of the insulating paste layer includes prepreg (PP).

According to an embodiment of the invention, the metal layer includes a copper foil layer.

According to an embodiment of the invention, the substrate is a single-layer circuit board.

According to an embodiment of the invention, the substrate is a multi-layer circuit board.

According to an embodiment of the invention, the substrate further includes a dielectric layer, a plurality of pads, and a patterned solder mask. The pads are respectively disposed on two opposite surfaces of the dielectric layer. The patterned solder mask covers the two opposite surfaces and exposes the plurality of pads. The first through hole penetrates the dielectric layer and the patterned solder mask.

According to an embodiment of the invention, the substrate further includes a plurality of vias. Each of the vias connects the corresponding pads correspondingly disposed on the two opposite surfaces.

According to an embodiment of the invention, the substrate structure further includes a surface finishing layer covering the pads.

According to an embodiment of the invention, the method of forming the first through hole and the second through hole includes mechanical drilling.

According to an embodiment of the invention, the method of providing the carrier further includes forming the carrier by laminating the release layer, the insulating paste layer, and the metal layer.

Based on the above, in the embodiments of the invention, the thickness of the substrate is rather thin, therefore, in order to prevent the substrate from cracking during the packaging process, the substrate is laminated on the carrier having the release layer, so as to increase an overall rigidity of the substrate structure. In addition, the substrate may be easily separated from the carrier after the manufacturing process is completed by employing the characteristic of the release layer being easily stripped from the substrate.

Besides, according to the embodiments of the invention, the substrate further includes at least one first through hole that may serve as a gas aperture for ventilation or a sound hole for resonance. Meanwhile, at least one second through hole corresponding to the first through hole is formed on the carrier. In this way, the first through hole of the substrate may be exposed by the carrier through the second through hole after the substrate is disposed on the carrier. Accordingly, in a subsequent thermal compression process or other high temperature processes, gas in the first through hole may be easily discharged from the second through hole without being accumulated between the substrate and carrier or pushing the carrier away due to thermal expansion, which may weaken the bonding strength between the substrate and the carrier and make the substrate separated from the carrier. Therefore, the substrate structure according to the embodiments of the invention not only meets special requirements for the substrate having special functions but also increases a yield rate of the substrate structure.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
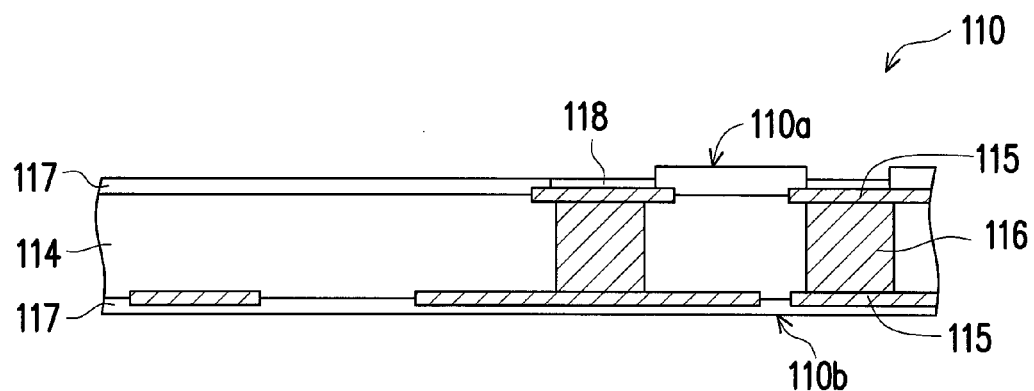
FIG. 1 to FIG. 6 are cross-sectional schematic views illustrating a manufacturing method of a substrate structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

It is to be understood that both of the foregoing and other detailed descriptions, features, and advantages are intended to be described more comprehensively by providing embodiments accompanied with figures hereinafter. In the following embodiments, wordings used to indicate directions, such as "up," "down," "front," "back," "left," and "right", merely refer to directions in the accompanying drawings. Therefore, the directional wording is used to illustrate rather than limit the invention. In addition, like or similar elements will be referred to by using like or similar reference numeral.

FIG. 1 to FIG. 6 are cross-sectional schematic views illustrating a manufacturing method of a substrate structure according to an embodiment of the invention. The manufacturing method of the substrate structure of this embodiment includes steps as follows. First, referring to FIG. 1, a substrate 110 is provided. The substrate 110 includes a first surface 110a and a second surface 110b opposite to the first surface 110a. Specifically, the substrate 110 may be a single-layer circuit board, as shown in FIG. 1, including a dielectric layer 114, a plurality of pads 115, a patterned solder mask 117, and a plurality of vias 116. The plurality of pads 115 are respectively disposed on two opposite surfaces of the dielectric layer 114. Each of the vias 116 connects to the corresponding pads 115 disposed on the two opposite surfaces of the dielectric layer 114. The patterned solder mask 117 covers the two opposite surfaces of the dielectric layer 114 and exposes the pads 115. Of course, in other embodiments, other stacked structures may be further stacked on the substrate 110. In other words, the substrate 110 may also be a multi-layer circuit board.

In addition, the substrate 110 may further include a surface finishing layer 118 covering the pads 115 exposed by the solder mask 117. A material of the surface finishing layer 118 may include a copper-base alloy, a nickel-base alloy, a palladium-base alloy, platinum-base alloy, a silver-base alloy, a gold-base alloy, a titanium-base alloy, or any combination thereof.

Figure 2:
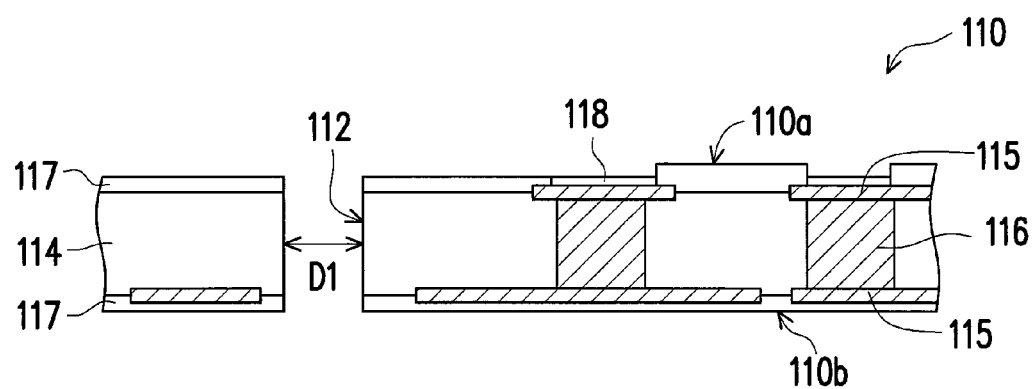

Referring to FIG. 2, a first through hole 112 is formed on the substrate 110. In addition, the first through hole 112 penetrates the substrate 110 to connect the first surface 110a and the second surface 110b. Furthermore, the first through hole 112 penetrates the dielectric layer 114 and the patterned solder mask 117 of the substrate 110, as shown in FIG. 2, to serve as a gas aperture for ventilation or a sound hole for resonance, for example. In this embodiment, a method for forming the first through hole 112 includes mechanical drilling or laser drilling. However, the invention is not limited thereto.

Figure 3:
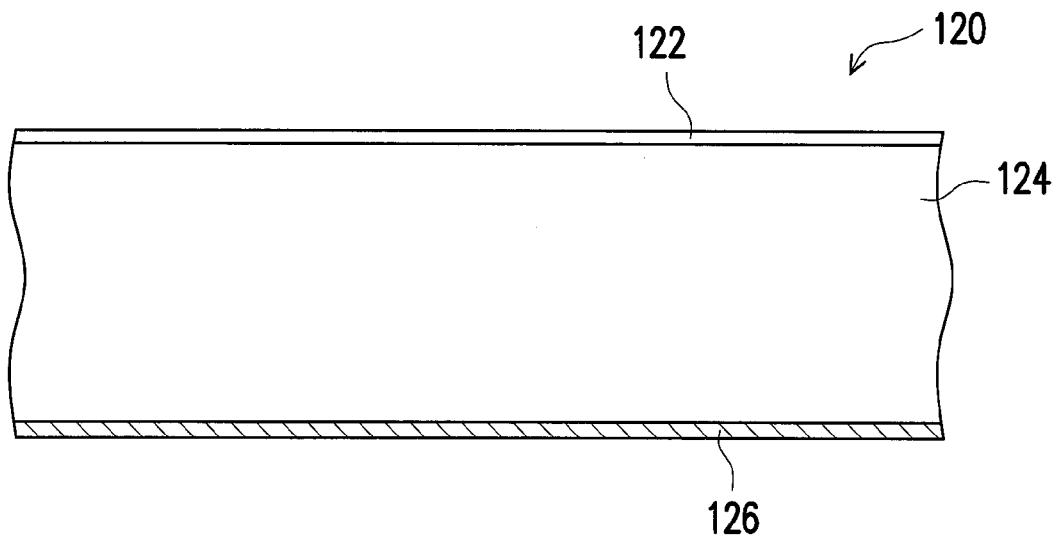

Then, referring to FIG. 3, a carrier 120 is provided. The carrier 120 includes a release layer 122, an insulating paste layer 124, and a metal layer 126. In this embodiment, the carrier 120 may be formed by sequentially laminating the release layer 122, the insulating paste layer 124, and the metal layer 126 together, for example. In this way, the insulating paste layer 124 is located between the release layer 122 and the metal layer 126. In addition, a material of the release layer 122 may include polyethylene terephthalate (PET), polyimide (PI) film, or other suitable materials. A material of the insulating paste layer 124 may include insulating paste materials such as prepreg, and the metal layer 126 may be a copper foil layer, for example. In addition, the sequence described in this embodiment only serves for illustration, and there is no fixed order between providing or manufacturing the substrate 110 and providing or manufacturing the carrier 120. In other embodiments of the invention, the carrier 120 may be provided before the substrate 110 is provided, or the carrier 120 and the substrate 110 that are already manufactured may be provided at the same time. The invention is not limited thereto.

Figure 4:
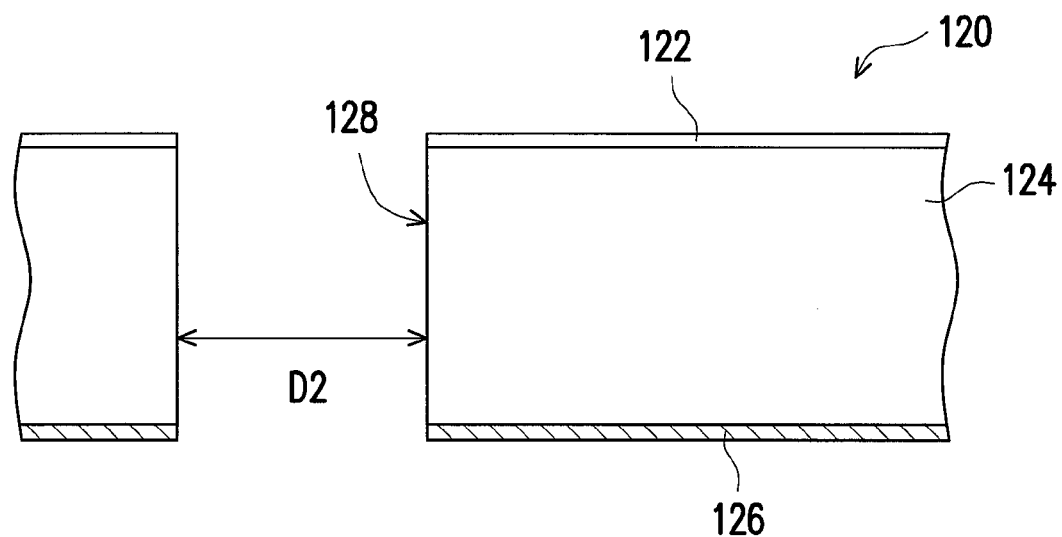

Then, referring to FIG. 4, a second through hole 128 is formed on the carrier 120. In addition, the second through hole 120 may respectively penetrate the release layer 122, the insulating paste layer 124, and the metal layer 126, thereby penetrating the carrier 120. In this embodiment, a diameter D2 of the second through hole 128 may be greater than a diameter D1 of the first through hole 112 shown in FIG. 2. In addition, a method for forming the second through hole 128 may be the same as or similar to the method for forming the first through hole 112. Namely, the method for forming the second through hole 128 also includes mechanical drilling or laser drilling. However, the invention is not limited thereto.

Figure 5:
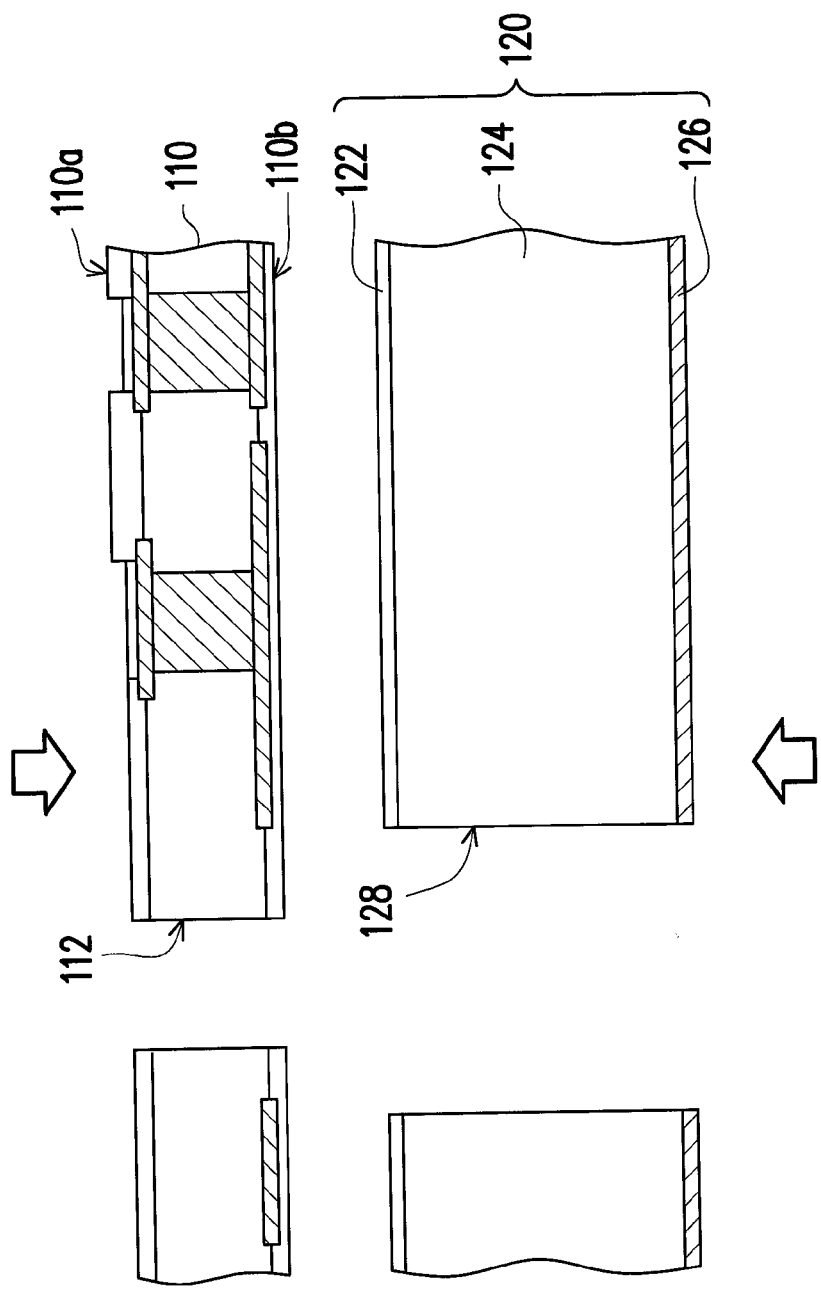
Figure 6:
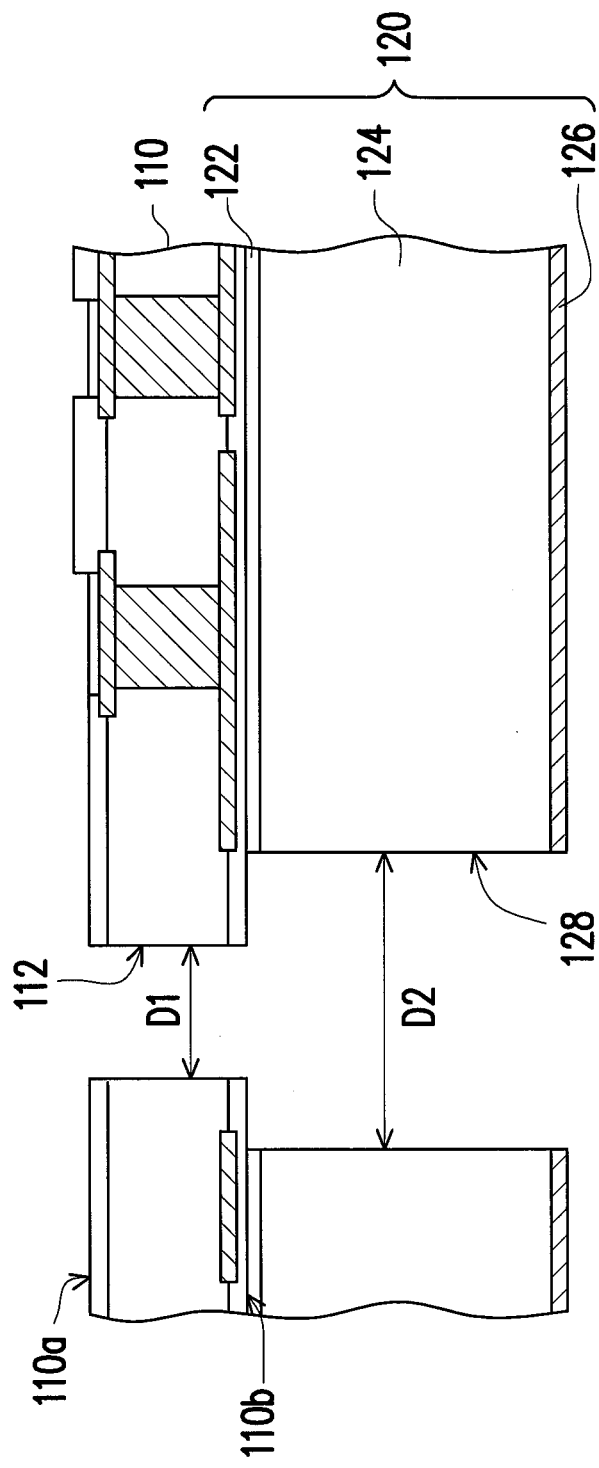

Then, referring to both FIG. 5 and FIG. 6, the substrate 110 and the carrier 120 are laminated together to form a substrate 110 shown in FIG. 6. Specifically, the substrate 110 is laminated on the carrier 120 by laminating the second surface 110b of the substrate 110 shown in FIG. 5 on the release layer 122. In addition, a position of the second through hole 128 may correspond to a position of the first through hole 112. In addition, the diameter D2 of the second through hole 128 may be substantially greater than the diameter D1 of the first through hole 112, thereby exposing the first through hole 112, as shown in FIG. 6. In this way, the manufacture of the substrate structure 110 may be completed.

The substrate structure 100 shown in FIG. 6 and manufactured according to the manufacturing method includes the substrate 110 and the carrier 120. The substrate 110 includes the first through hole 112, the first surface 110a and the second surface 110b opposite to the first surface 110a. The first through hole 112 penetrates the substrate 110 for connecting the first surface 110a and the second surface 110b. The carrier 120 includes the second through hole 128, the release layer 122, the insulating paste layer 124, and the metal layer 126. The insulating paste layer 124 is located between the release layer 122 and the metal layer 126. The carrier 120 is attached to the substrate 110 by attaching the release layer 122 of the carrier 120 to the second surface 110b of the substrate 110. The second through hole 128 corresponds to the first through hole 112 and penetrates the carrier 120, thereby exposing the first through hole 112. In addition, the diameter D2 of the second through hole 128 may be substantially greater than the diameter D1 of the first through hole 112.

In view of the foregoing, the thickness of the substrate according to the embodiments of the invention is rather thin, therefore, to prevent the substrate from cracking during the packaging process, the substrate is laminated on the carrier having the release layer, so as to increase an overall rigidity of the substrate structure. In addition, the substrate may be easily separated from the carrier after the manufacturing process is finished by taking advantage of the characteristic of the release layer being easily stripped from the substrate.

Moreover, the substrate according to the embodiments of the invention further includes the first through hole that may serve as a gas aperture for ventilation or a sound hole for resonance. Meanwhile, the second through hole corresponding to the first through hole is formed on the carrier. In this way, the first through hole of the substrate may be exposed by the carrier through the second through hole after the substrate is disposed on the carrier. Accordingly, in a subsequent thermal compression process or other high temperature processes, gas in the first through hole may be easily discharged from the second through hole without being accumulated between the substrate and carrier or pushing the carrier away due to thermal expansion, which may weaken the bonding strength between the substrate and the carrier and make the substrate separated from the carrier. Therefore, the substrate structure according to the embodiments of the invention not only meets special requirements for a substrate having special functions but also increases a yield rate of the substrate structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate structure, comprising:
a substrate, comprising a dielectric layer, a plurality of pads, a patterned solder mask, a first through hole, a first surface, and a second surface opposite to the first surface, the plurality of pads being respectively disposed on two opposite surfaces of the dielectric layer, the patterned solder mask covering the two opposite surfaces and exposing the plurality of pads, wherein the first through hole penetrates the substrate for connecting the first surface and the second surface and the first through hole penetrates the dielectric layer and the patterned solder mask; and
a carrier, comprising a second through hole, a release layer, an insulating paste layer, and a metal layer, wherein the insulating paste layer is disposed between the release layer and the metal layer, the carrier is attached to the second surface by attaching the release layer to the second surface and contacting the release layer with the patterned solder mask, the second through hole corresponds to the first through hole and penetrates the carrier for exposing the first through hole, and a smallest diameter of the second through hole is greater than a largest diameter of the first through hole.

2. The substrate structure as claimed in claim 1, wherein a material of the release layer comprises polyethylene terephthalate (PET) or polyimide (PI) film.

3. The substrate structure as claimed in claim 1, wherein a material of the insulating paste layer comprises prepreg (PP).

4. The substrate structure as claimed in claim 1, wherein the metal layer comprises a copper foil layer.

5. The substrate structure as claimed in claim 1, wherein the substrate is a single-layer circuit board.

6. The substrate structure as claimed in claim 1, wherein the substrate is a multi-layer circuit board.

7. The substrate structure as claimed in claim 1, wherein the substrate further comprises a plurality of vias, each of the vias connecting the corresponding pads disposed on the two opposite surfaces.

8. The substrate structure as claimed in claim 1, further comprising:
a surface finishing layer, covering the plurality of pads.

9. A manufacturing method of a substrate structure, comprising:
providing a substrate comprising a dielectric layer, a plurality of pads, a patterned solder mask, a first surface and a second surface opposite to the first surface, the plurality of pads being respectively disposed on two opposite surfaces of the dielectric layer, the patterned solder mask covering the two opposite surfaces and exposing the plurality of pads;
forming a first through hole on the substrate, wherein the first through hole penetrates the substrate for connecting the first surface and the second surface and the first through hole penetrates the dielectric layer and the patterned solder mask;
providing a carrier comprising a release layer, an insulating paste layer, and a metal layer, wherein the insulating paste layer is disposed between the release layer and the metal layer;
forming a second through hole on the carrier, wherein the second through hole penetrates the carrier, and a smallest diameter of the second through hole is greater than a largest diameter of the first through hole; and
laminating the substrate on the release layer of the carrier, so that the release layer contacts the patterned solder mask, wherein a position of the second through hole corresponds to a position of the first through hole for exposing the first through hole.

10. The manufacturing method of the substrate structure as claimed in claim 9, wherein the method of forming the first through hole and the second through hole comprises mechanical drilling.

11. The manufacturing method of the substrate structure as claimed in claim 9, wherein a material of the release layer comprises polyethylene terephthalate (PET) or polyimide (PI) film.

12. The manufacturing method of the substrate structure as claimed in claim 9, wherein a material of the insulating paste layer comprises prepreg.

13. The manufacturing method of the substrate structure as claimed in claim 9, wherein the metal layer comprises a copper foil layer.

14. The manufacturing method of the substrate structure as claimed in claim 9, wherein the method of providing the carrier further comprises:
   forming the carrier by laminating the release layer, the insulating paste layer, and the metal layer.

15. The substrate structure as claimed in claim 1, wherein the first though hole is adjacent to the pads.

16. The manufacturing method of the substrate structure as claimed in claim 9, wherein the first through hole is adjacent to the pads.

* * * * *